(12) United States Patent
Feng et al.

(10) Patent No.: US 9,455,194 B1
(45) Date of Patent: Sep. 27, 2016

(54) METHOD FOR FABRICATING SEMICONDUCTOR DEVICE

(71) Applicant: UNITED MICROELECTRONICS CORP., Hsin-Chu (TW)

(72) Inventors: Li-Wei Feng, Kaohsiung (TW); Chien-Ting Lin, Hsinchu (TW); Shih-Hung Tsai, Tainan (TW); Ssu-I Fu, Kaohsiung (TW); Hon-Huei Liu, Kaohsiung (TW); Shih-Fang Hong, Tainan (TW); Chao-Hung Lin, Changhua County (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/864,852

(22) Filed: Sep. 24, 2015

(30) Foreign Application Priority Data

Aug. 28, 2015 (CN) .......................... 2015 1 0537533

(51) Int. Cl.
| | |
|---|---|
| *H01L 21/461* | (2006.01) |
| *H01L 21/8234* | (2006.01) |
| *H01L 21/3065* | (2006.01) |
| *H01L 21/308* | (2006.01) |

(52) U.S. Cl.
CPC ... *H01L 21/823412* (2013.01); *H01L 21/3065* (2013.01); *H01L 21/3085* (2013.01); *H01L 21/3086* (2013.01); *H01L 21/3088* (2013.01); *H01L 21/823431* (2013.01)

(58) Field of Classification Search
CPC ........................ H01L 21/3065; H01L 21/3085

USPC ............................................. 216/46; 438/696
See application file for complete search history.

(56) References Cited

U.S. PATENT DOCUMENTS

| | | | |
|---|---|---|---|
| 5,328,810 A | 7/1994 | Lowrey et al. | |
| 8,216,947 B2 | 7/2012 | Lee et al. | |
| 8,679,981 B1 | 3/2014 | Weling et al. | |
| 2013/0143372 A1* | 6/2013 | Kim | ............ H01L 21/3081 438/163 |
| 2013/0234301 A1* | 9/2013 | Wang | .............. H01L 21/0337 257/635 |
| 2015/0011090 A1 | 1/2015 | Liang et al. | |

OTHER PUBLICATIONS

Feng, Title of Invention: Method of Forming a Semiconductor Structure, U.S. Appl. No. 14/629,491, filed Feb. 24, 2015.

* cited by examiner

*Primary Examiner* — Roberts Culbert
(74) *Attorney, Agent, or Firm* — Winston Hsu; Scott Margo (57) ABSTRACT

A method for fabricating semiconductor device is disclosed. The method includes the steps of: providing a substrate having a first region and a second region defined thereon; forming a material layer on the substrate; forming a plurality of first mandrels on the material layer of the first region and the second region; forming first spacers adjacent to the first mandrels; forming a hard mask on the first region; trimming the first spacers on the second region; removing the first mandrels; using the first spacers to remove part of the material layer for forming a plurality of second mandrels; forming second spacers adjacent to the second mandrels; removing the second mandrels; and using the second spacers to remove part of the substrate for forming a plurality of fin-shaped structures.

6 Claims, 8 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of using two sidewall image transfer (SIT) processes for forming fin-shaped structure on a substrate.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to a first embodiment of the present invention, a method for fabricating semiconductor device is disclosed. The method includes the steps of: providing a substrate having a first region and a second region defined thereon; forming a material layer on the substrate; forming a plurality of first mandrels on the material layer of the first region and the second region; forming first spacers adjacent to the first mandrels; forming a hard mask on the first region; trimming the first spacers on the second region; removing the first mandrels; using the first spacers to remove part of the material layer for forming a plurality of second mandrels; forming second spacers adjacent to the second mandrels; removing the second mandrels; and using the second spacers to remove part of the substrate for forming a plurality of fin-shaped structures.

According to another aspect of the present invention, a method for fabricating semiconductor device is disclosed. The method includes the steps of: providing a substrate having a first region and a second region defined thereon; forming a material layer on the substrate; forming a plurality of first mandrels on the material layer of the first region and the second region; forming first spacers adjacent to the first mandrels; forming a hard mask on the first region; removing the first mandrels from the second region; removing the hard mask; using the first mandrels and the first spacers on the first region and the first spacers on the second region to remove part of the material layer for forming a plurality of second mandrels; forming second spacers adjacent to the second mandrels; removing the second mandrels; and using the second spacers to remove part of the substrate for forming a plurality of fin-shaped structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
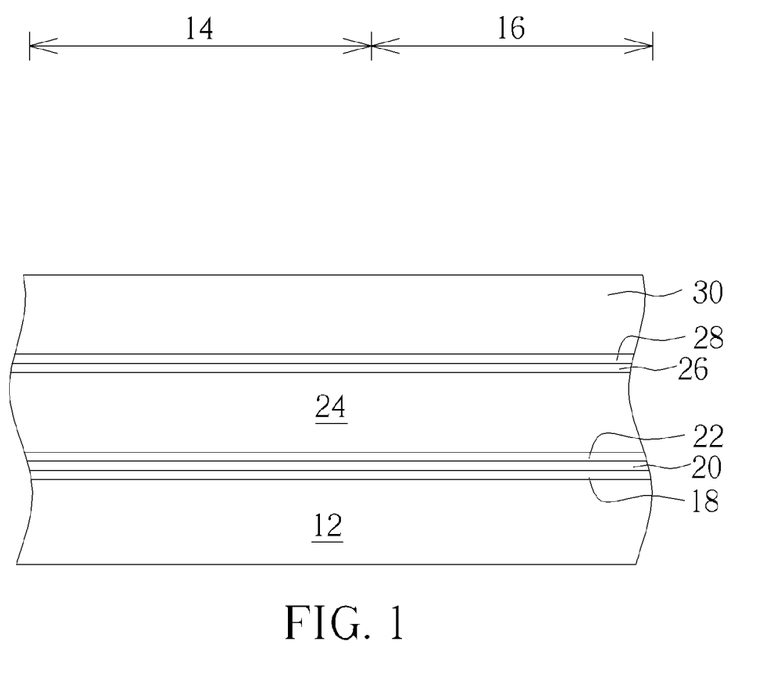
FIGS. 1-9 illustrate a method for fabricating semiconductor device according to a first embodiment of the present invention.

Referring to FIGS. 1-9, FIGS. 1-9 illustrate a method for fabricating semiconductor device according to a first embodiment of the present invention. As shown in FIG. 1, a substrate 12, such as a silicon substrate is provided, and a first region 14 and a second region 16 are defined on the substrate 12. Next, a pad oxide layer 18, a pad nitride layer 20, and an oxide layer 22 are sequentially formed on the substrate 12, a material layer 24 is formed on the oxide layer 22, and a silicon nitride layer 26, an oxide layer 28, and another material layer 30 are formed on the material layer 24. In this embodiment, the material layer 30 and material layer 24 are preferably composed of same material, such as both being composed of amorphous silicon, but not limited thereto.

Figure 2:
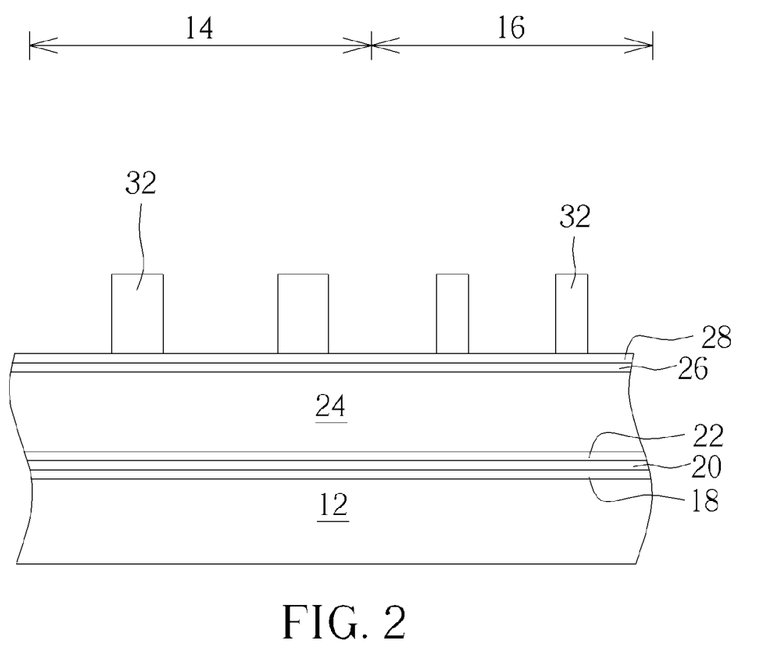

Next, as shown in FIG. 2, a pattern transfer process is conducted on the material layer 30. For instance, a patterned resist (not shown) could be formed on the material layer 30, and etching processes are conducted to remove part of the material layer 30 not covered by the patterned resist to form a plurality of patterned material layers or plurality of first mandrels 32 on the first region 14 and second region 16. It should be noted that since the first region 14 is used to fabricate semiconductor devices with larger pitches or gaps while the second region 16 is used to fabricate semiconductor devices with smaller pitches or gaps in the later process, it would be desirable to adjust the size of the mask during the patterning of material layer 30 for forming first mandrels 32 with different widths on the first region 14 and second region 16 respectively. Preferably, the pitch of each first mandrel 32 formed on the second region 16 is the critical dimension of the aforementioned pattern transfer process and in this embodiment, the width of each first mandrel 32 on the first region 14 is preferably larger than the width of each first mandrel 32 on the second region 16.

Figure 3:
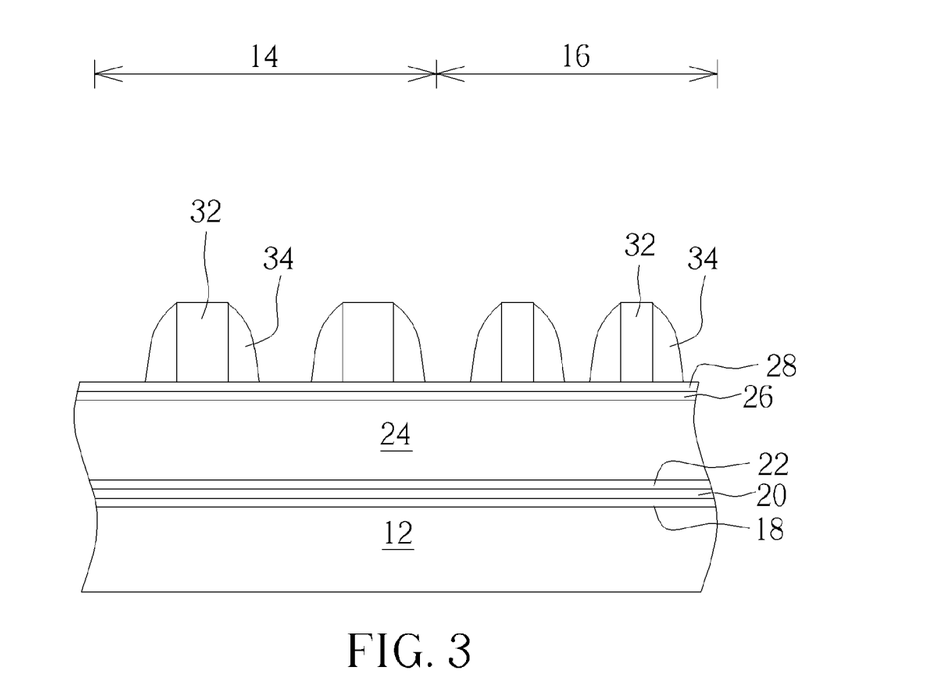

Next, as shown in FIG. 3, a plurality of spacers 34 are formed adjacent to the first mandrels 32. In this embodiment, the formation of the spacers 34 could be accomplished by first forming a cap layer (not shown) on the oxide layer 28 and covering all of the first mandrels 32, and an etching back is conducted to remove part of the cap layer for forming a spacer 34 adjacent to each first mandrel 32. Preferably, the spacers 34 and the oxide layer 28 underneath are composed of different material. For instance, the spacers 34 could be composed of material such as silicon nitride, but not limited thereto.

Figure 4:
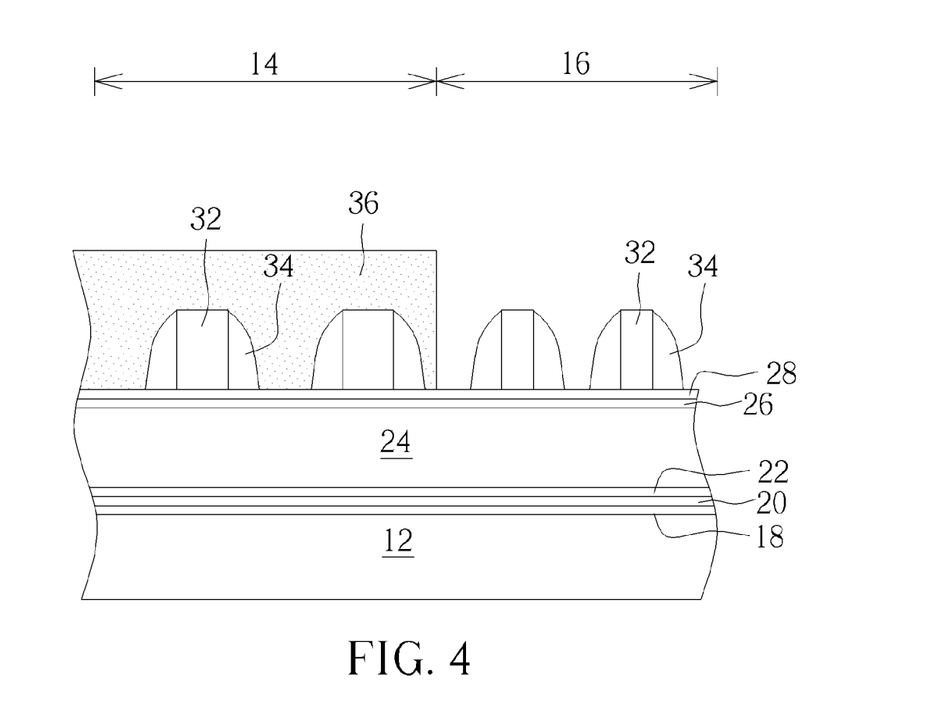

Next, as shown in FIG. 4, a hard mask 36 is formed on the first region 14 to cover the first mandrels 32 and part of the oxide layer 28. In this embodiment, the hard mask 36 could be a patterned resist, but not limited thereto.

Figure 5:
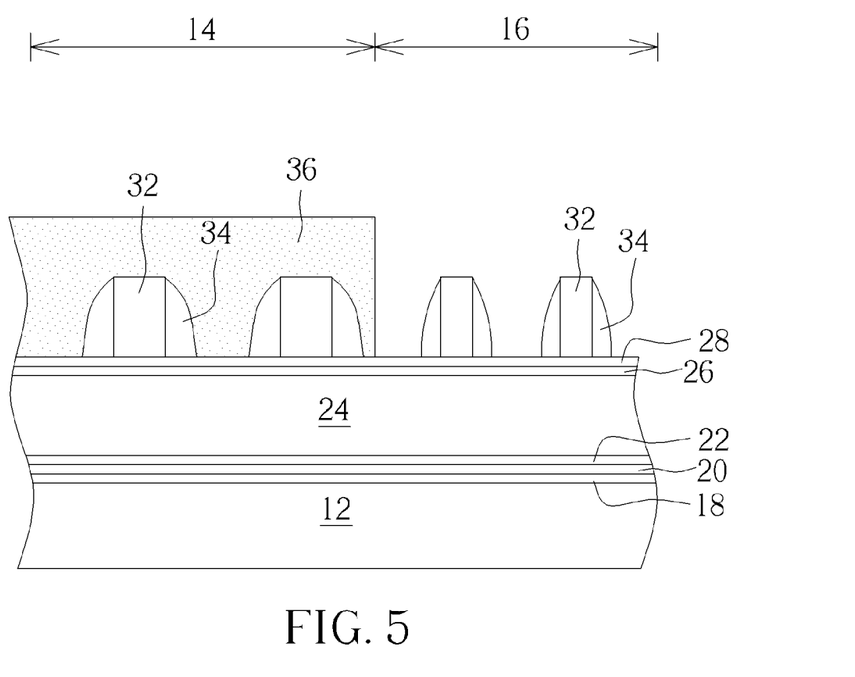

Next, as shown in FIG. 5, a trimming process is conducted by using the hard mask 36 covering the first region 14 as mask to remove or trim part of the spacers 34 on the second region 16 through method such as etching process.

Figure 6:
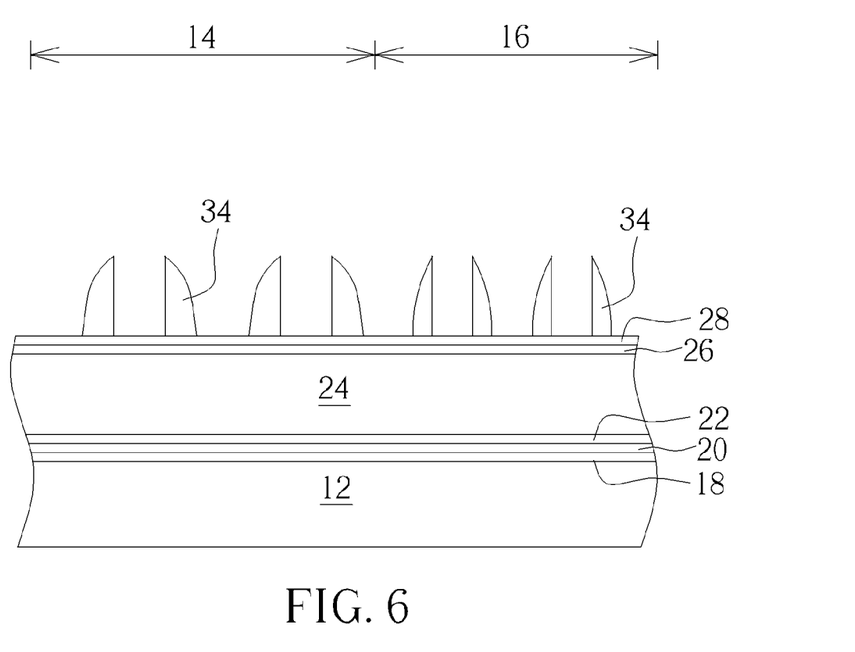

Next, as shown in FIG. 6, the hard mask 36 is removed from first region 14, and an etching process is conducted to remove the first mandrels 32 from the first region 14 and second region 16 so that only spacers 34 are remained on the oxide layer 28.

Figure 7:
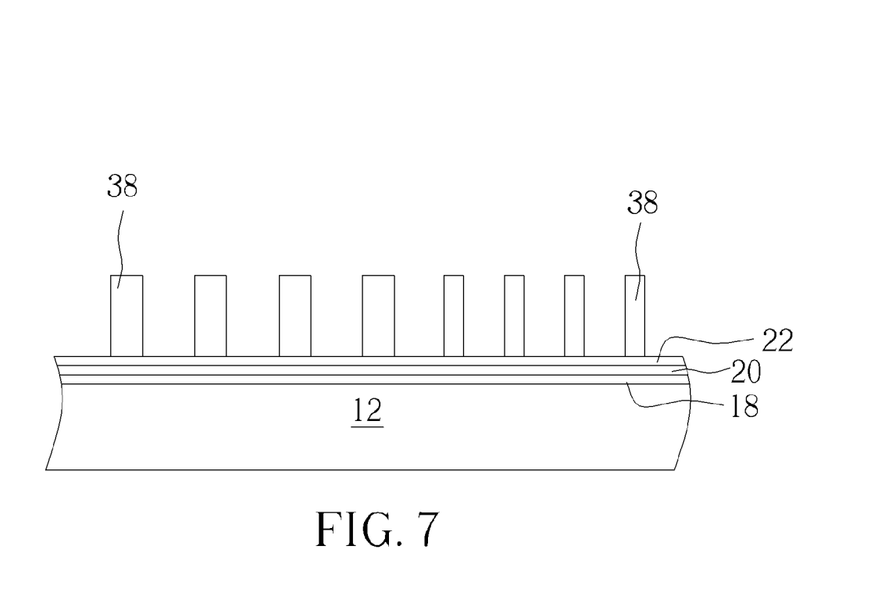

Next, as shown in FIG. 7, the pattern of the spacers 34 are transferred to the material layer 24. For instance, an etching process is conducted by using the spacers 34 on first region 14 and second region 16 as mask to remove part of the oxide layer 28, part of the silicon nitride layer 26, and part of the material layer 24 not covered by the spacers 34 for forming a plurality of second mandrels 38 constituted by patterned material layers 24 on the oxide layer 22. The remaining spacers 34, oxide layer 28, and silicon nitride layer 26 on the second mandrels 38 are removed thereafter. It should be noted that since the spacers 34 on second region 16 had already been trimmed in FIG. 5, the width of each second mandrel 38 on first region 14 would be substantially larger than the width of each second mandrel 38 on second region 16 after the pattern of spacers 34 is transferred to the material layer 24.

Figure 8:
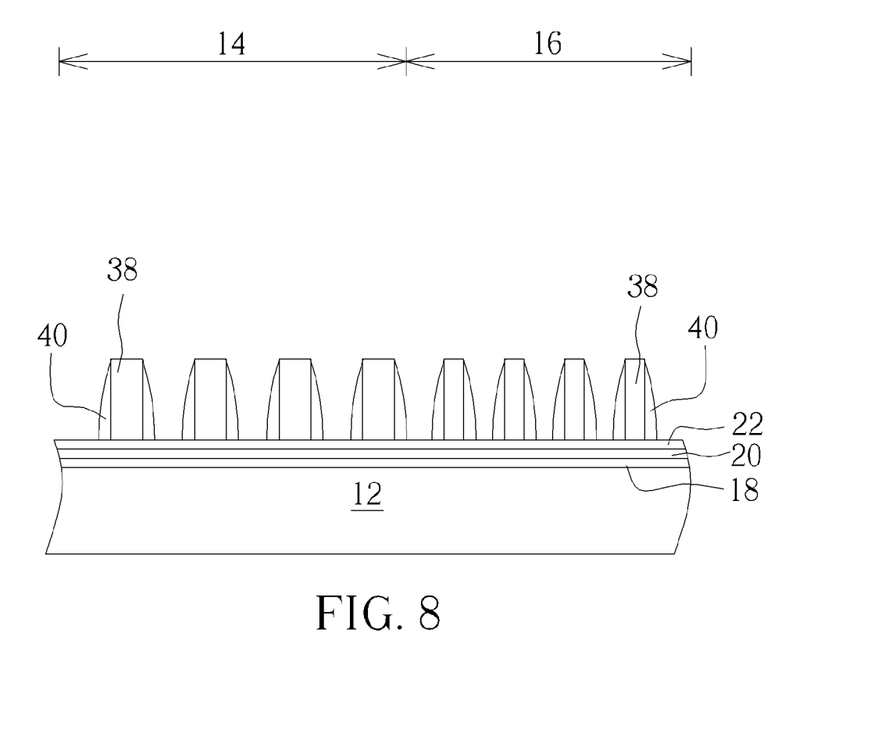

Next, as shown in FIG. 8, a plurality of spacers 40 are formed adjacent to the second mandrels 38, in which the formation of the spacers 40 could be accomplished by same means conducted in FIG. 3 for forming spacers 34, and the details of which are not explained herein for the sake of brevity.

Figure 9:
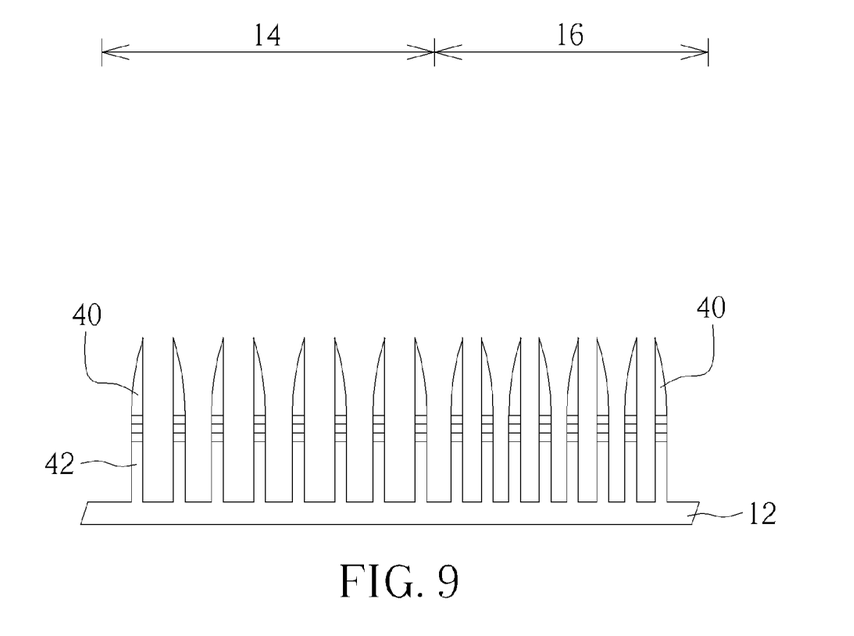

Next, as shown in FIG. 9, after removing the second mandrels 38 from the first region 14 and second region 16, the spacers 40 on the first region 14 and second region 16 are used as mask to remove part of the oxide layer 22, part of the pad nitride layer 20, part of the pad oxide layer 18, and part of the substrate 12 not covered by the spacers 40 along with a fin-cut process for forming a plurality of fin-shaped structures 42 on the substrate 12. Next, the remaining spacers 40, oxide layer 22, pad nitride layer 20, and pad oxide layer 18 could be removed according to the demand of the process and fabrication of FinFET transistor or semiconductor device could be conducted thereafter. For instance, shallow trench isolation (STI) (not shown) could be formed between the fin-shaped structures 42 and elements such as gate structures and source/drain regions could be formed on the fin-shaped structures. This completes the fabrication of a semiconductor device according to a first embodiment of the present invention.

Figure 10:
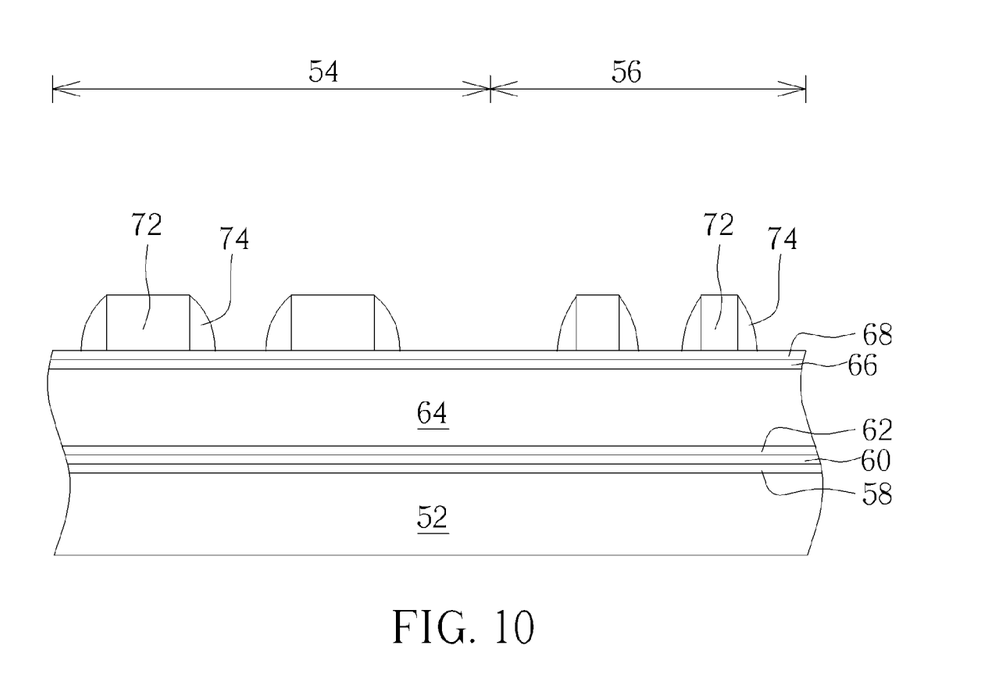
FIGS. 10-15 illustrate a method for fabricating semiconductor device according to a second embodiment of the present invention.

Referring to FIGS. 10-15, FIGS. 10-15 illustrate a method for fabricating semiconductor device according to a second embodiment of the present invention. As shown in FIG. 10, fabrication processes conducted in FIGS. 1-3 could be carried out by first forming a pad oxide layer 58, a pad nitride layer 60, an oxide layer 62, a material layer 64, a silicon nitride layer 66, an oxide layer 68, and another material layer (not shown) on a substrate 52, and then patterning the material layer to form a plurality of first mandrels 72 and a plurality of spacers 74 adjacent to the first mandrels 72. Similar to the aforementioned embodiment, the width of each first mandrel 72 on the first region 54 is preferably larger than the width of each first mandrel 72 on the second region 56, and the pitch of each first mandrel 72 formed on the second region 56 is the critical dimension of the aforementioned pattern transfer process in this embodiment.

Figure 11:
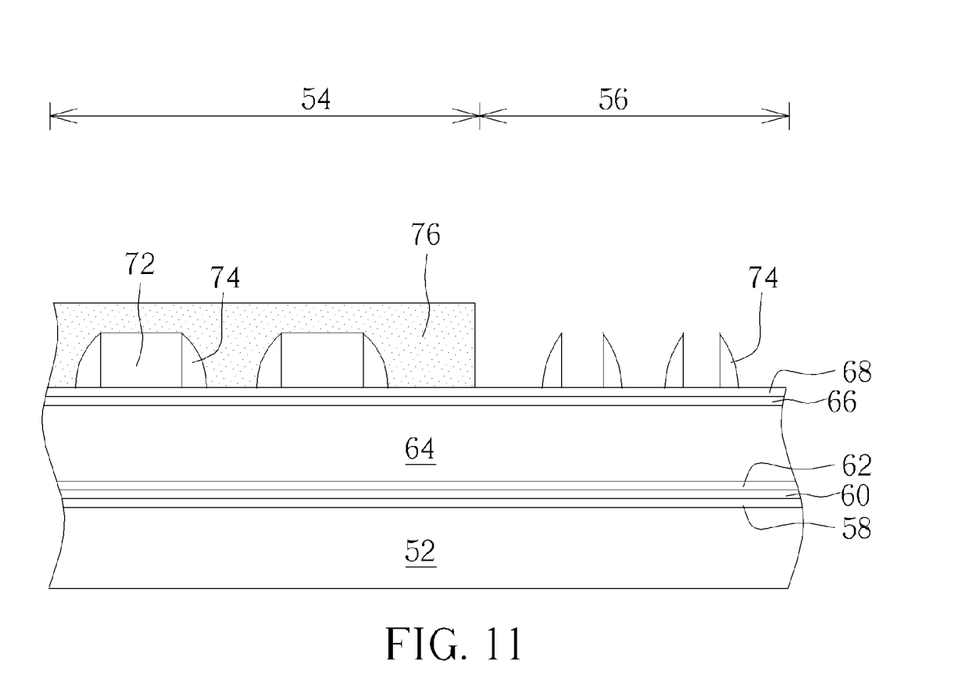

Next, as shown in FIG. 11, a hard mask 76 is formed on the first region 54, and an etching process is conducted by using the hard mask 76 as mask to remove the first mandrels 72 from the second region 56. In this embodiment, the hard mask 76 could be a patterned resist, but not limited thereto. According to an embodiment of the present invention, before or after removing the first mandrels 72 from second region 56, it would be desirable to selectively carry out the step in FIG. 5 by using the hard mask 76 on first region 54 to conduct a trimming process for removing or trimming part of the spacers 74 on the second region 56 through etching process, which is also within the scope of the present invention.

Figure 12:
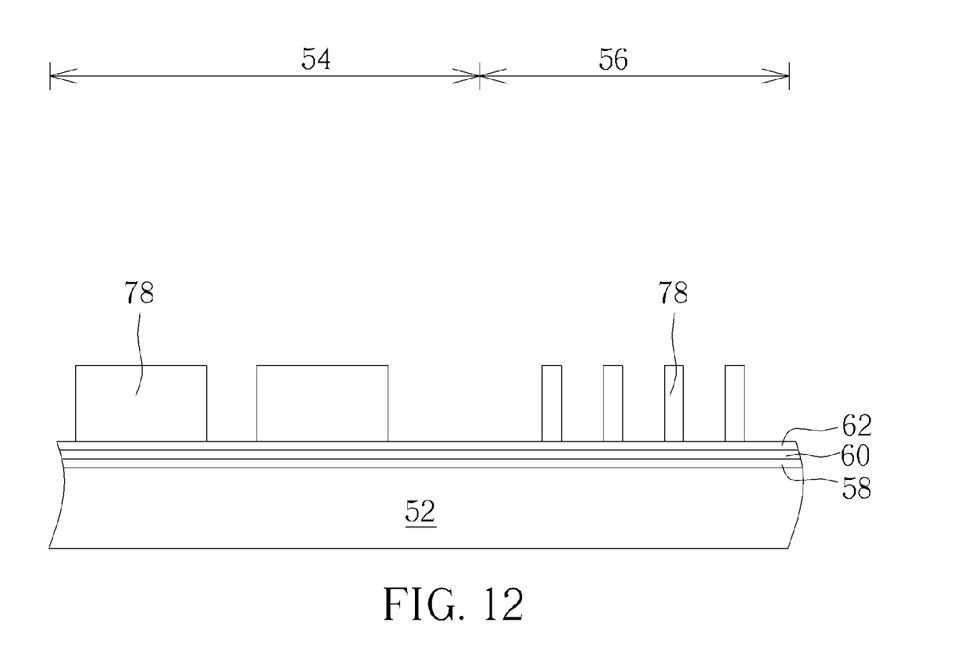

Next, as shown in FIG. 12, after removing the hard mask 76, an etching process is conducted by using the first mandrels 72 and spacers 74 on the first region 54 and the spacers 74 on the second region 56 as mask to remove part of the oxide layer 68, part of the silicon nitride layer 66, and part of the material layer 64 not covered by the first mandrels 72 and spacers 74 for forming a plurality of second mandrels 78 consisting of plurality of patterned material layers 64 on the oxide layer 62. The remaining first mandrels 72, spacers 74, oxide layer 68, and silicon nitride layer 66 are removed thereafter.

It should be noted that since the patterns of the second mandrels 78 on first region 54 are transferred from the first mandrels 72 and spacers 74 on first region 54 in FIG. 11, the width of each second mandrel 78 on first region 54 in FIG. 12 is preferably equivalent to the total width of each first mandrel 72 and surrounding spacer 74 combined in FIG. 11. Moreover, since the second mandrels 78 on the second region 56 are transferred from the spacers 74 on second region 56 in FIG. 11, the width of each second mandrel 78 on second region 56 in FIG. 12 is preferably equivalent to the width of each spacer 74 on second region 56 in FIG. 11.

Figure 13:
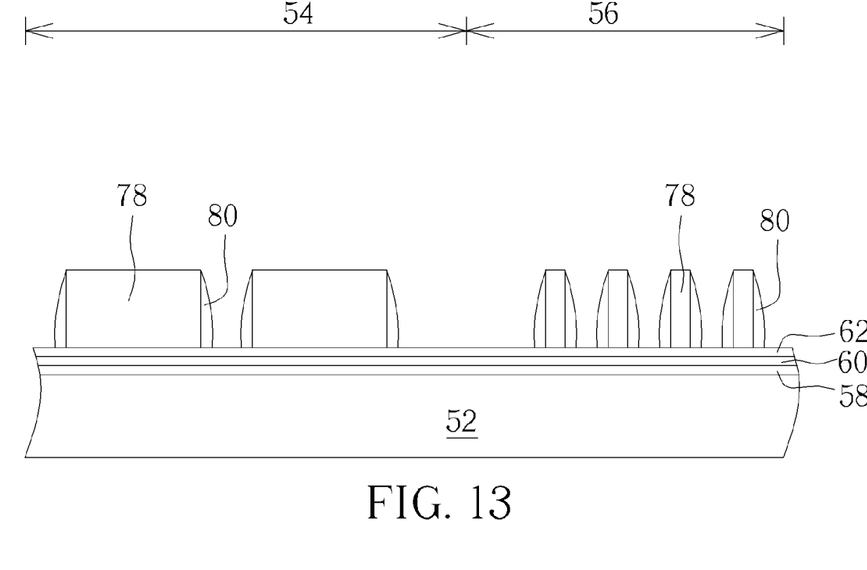

Next, as shown in FIG. 13, a plurality of spacers 80 are formed adjacent to the second mandrels 78, in which the formation of the spacers 80 could be accomplished by same means conducted in FIG. 3 for forming spacers 34, and the details of which are not explained herein for the sake of brevity.

Figure 14:
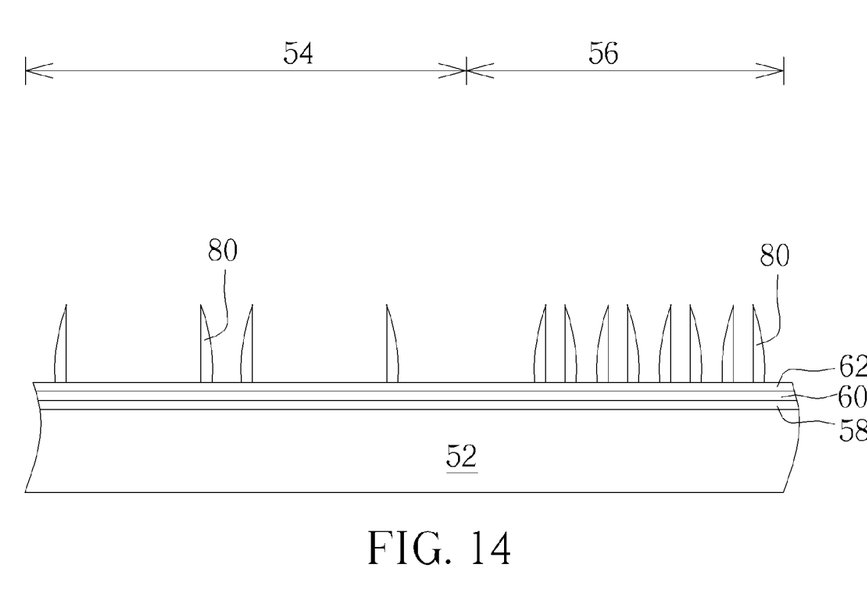

Next, as shown in FIG. 14, the second mandrels 78 are removed from first region 54 and second region 56 to expose the oxide layer 62 underneath.

Figure 15:
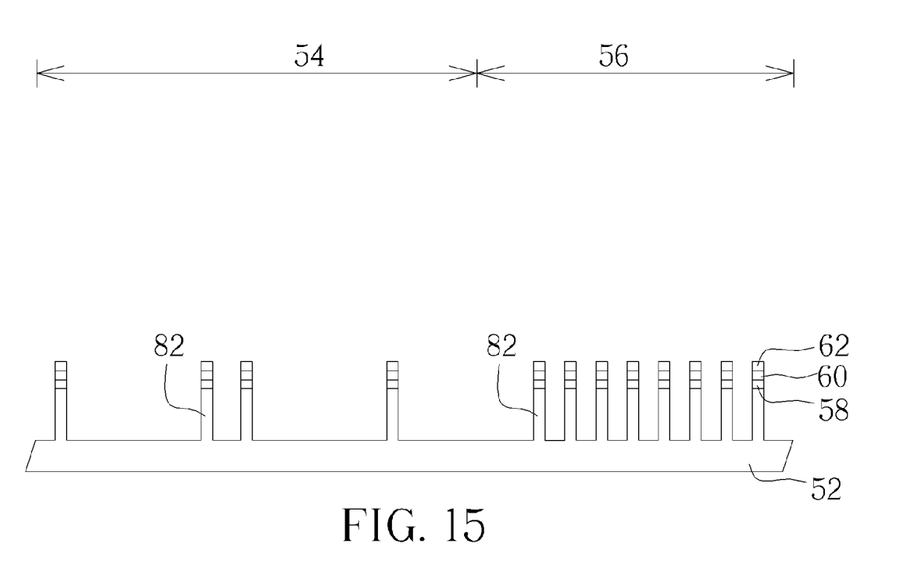

Next, as shown in FIG. 15, an etching process is conducted by using the spacers 80 on first region 54 and spacers 80 on second region 56 as mask to remove part of the oxide layer 62, part of the pad nitride layer 60, part of the pad oxide layer 58, and part of the substrate 52 for forming a plurality of fin-shaped structures 82. The spacers 80 are then removed thereafter. Next, the oxide layer 62, pad nitride layer 60, and pad oxide layer 58 on each fin-shaped structure 82 could be removed according to the demand of the process and fabrication of FinFET transistor or semiconductor device could be conducted thereafter. For instance, shallow trench isolation (STI) (not shown) could be formed between the fin-shaped structures 82 and elements such as gate structures and source/drain regions could be formed on the fin-shaped structures 82. This completes the fabrication of a semiconductor device according to a second embodiment of the present invention.

Overall, the present invention discloses an approach of using two sidewall image transfer (SIT) technique to form fin-shaped structures on the substrate. Preferably, the first embodiment of the present invention first forms a plurality of first mandrels with different widths on first region and second region of a substrate, forms spacers adjacent to the first mandrels, trims the spacers on second region, transfers the pattern of the spacers to the material layer underneath to form second mandrels, forms spacers adjacent to the second mandrels, removes the second mandrels, and then transfer the pattern of spacers adjacent to the second mandrels to the substrate for forming fin-shaped structures. According to the first embodiment of the present invention, the gaps or distances between fin-shaped structures on the first region are equivalent to each other, the gaps or distances between fin-shaped structures on the second region are also equivalent to each other, and the gaps or distances between fin-shaped structures on first region are preferably larger than the gaps between fin-shaped structures on second region.

The second embodiment of the present invention first forms a plurality of first mandrels with different widths on first region and second region of a substrate, removes the first mandrels from second region, and then transfers the pattern of the first mandrels and spacers on first region and the spacers on second region to the material layer underneath for forming second mandrels. Next, spacers are formed adjacent to the second mandrels, second mandrels are removed, and the pattern of the spacers adjacent to the second mandrels is transferred to the substrate for forming fin-shaped structures. According to the second embodiment of the present invention, the gaps or distances between fin-shaped structures on the first region are different to each other, the gaps or distances between fin-shaped structures on the second region however are equivalent to each other, and the gaps or distances between fin-shaped structures on first region are preferably larger than the gaps or distances between fin-shaped structures on second region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region defined thereon;
    forming a material layer on the substrate;
    forming a plurality of first mandrels on the material layer of the first region and the second region;
    forming first spacers adjacent to the first mandrels;
    forming a hard mask on the first region;
    trimming the first spacers on the second region;
    removing the first mandrels;
    using the first spacers to remove part of the material layer for forming a plurality of second mandrels;
    forming second spacers adjacent to the second mandrels;
    removing the second mandrels; and
    using the second spacers to remove part of the substrate for forming a plurality of fin-shaped structures.

2. The method of claim 1, wherein the width of each of the first mandrels on the first region is larger than the width of each of the first mandrels on the second region.

3. The method of claim 1, wherein the width of each of the second mandrels on the first region is larger than the width of each of the second mandrels on the second region.

4. A method for fabricating semiconductor device, comprising:
    providing a substrate having a first region and a second region defined thereon;
    forming a material layer on the substrate;
    forming a plurality of first mandrels on the material layer of the first region and the second region;
    forming first spacers adjacent to the first mandrels;
    forming a hard mask on the first region;
    removing the first mandrels from the second region;
    removing the hard mask;
    using the first mandrels and the first spacers on the first region and the first spacers on the second region to remove part of the material layer for forming a plurality of second mandrels;
    forming second spacers adjacent to the second mandrels;
    removing the second mandrels; and
    using the second spacers to remove part of the substrate for forming a plurality of fin-shaped structures.

5. The method of claim 4, wherein the width of each of the first mandrels on the first region is larger than the width of each of the first mandrels on the second region.

6. The method of claim 4, wherein the width of each of the second mandrels on the first region is larger than the width of each of the second mandrels on the second region.

* * * * *